United States Patent
Liu

(10) Patent No.: US 11,177,356 B2
(45) Date of Patent: Nov. 16, 2021

(54) THIN FILM TRANSISTOR, ARRAY SUBSTRATE, DISPLAY APPARATUS, AND METHOD OF FABRICATING THIN FILM TRANSISTOR

(71) Applicant: BOE Technology Group Co., Ltd., Beijing (CN)

(72) Inventor: Wei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 496 days.

(21) Appl. No.: 16/080,958

(22) PCT Filed: Aug. 31, 2017

(86) PCT No.: PCT/CN2017/099983
§ 371 (c)(1),
(2) Date: Aug. 29, 2018

(87) PCT Pub. No.: WO2019/041248
PCT Pub. Date: Mar. 7, 2019

(65) Prior Publication Data
US 2021/0184006 A1 Jun. 17, 2021

(51) Int. Cl.
*H01L 27/00* (2006.01)
*H01L 29/00* (2006.01)
(Continued)

(52) U.S. Cl.
CPC .... *H01L 29/41733* (2013.01); *H01L 27/1225* (2013.01); *H01L 27/1259* (2013.01); *H01L 29/7869* (2013.01)

(58) Field of Classification Search
CPC ............. H01L 27/1225; H01L 27/1259; H01L 27/124; H01L 27/3262; H01L 27/1214;
(Continued)

(56) References Cited

U.S. PATENT DOCUMENTS 5,561,075 A * 10/1996 Nakazawa ........ H01L 29/66757
438/30
5,981,317 A 11/1999 French et al.
(Continued)

FOREIGN PATENT DOCUMENTS

CN 1577895 A 2/2005
CN 101278403 A 10/2008
(Continued)

OTHER PUBLICATIONS

International Search Report & Written Opinion dated May 30, 2018, regarding PCT/CN2017/099983.
(Continued)

*Primary Examiner* — Nikolay K Yushin
(74) *Attorney, Agent, or Firm* — Intellectual Valley Law, P.C.

(57) ABSTRACT

The present application discloses a thin film transistor. The thin film transistor includes a first source electrode and a first drain electrode spaced apart from each other; an active layer on the first source electrode and the first drain electrode, the active layer having a channel part between the first source electrode and the first drain electrode, a source electrode contact part in contact with the first source electrode, and a drain electrode contact part in contact with the first drain electrode; a second source electrode on a side of the source electrode contact part distal to the first source electrode, the second source electrode being electrically connected to the first source electrode; and a second drain electrode on a side of the drain electrode contact part distal to the first drain electrode, the second drain electrode being electrically connected to the first drain electrode.

18 Claims, 14 Drawing Sheets

(51) Int. Cl.
*H01L 29/417* (2006.01)
*H01L 27/12* (2006.01)
*H01L 29/786* (2006.01)

(58) Field of Classification Search
CPC ........... H01L 27/1251; H01L 29/41733; H01L 29/7869; H01L 29/786; H01L 29/78675; H01L 29/42384
See application file for complete search history.

(56) References Cited

U.S. PATENT DOCUMENTS

| | | | |
|---|---|---|---|
| 8,901,658 | B2 * | 12/2014 | Wang ............... H01L 29/78693 257/353 |
| 2003/0201440 | A1 | 10/2003 | Satou et al. |
| 2005/0012228 | A1 | 1/2005 | Hiramatsu et al. |
| 2007/0087487 | A1 | 4/2007 | Honda |
| 2008/0230835 | A1 | 9/2008 | Lae |
| 2010/0159639 | A1 | 6/2010 | Lae |
| 2013/0075721 | A1 | 3/2013 | Yamazaki et al. |
| 2013/0075722 | A1 | 3/2013 | Takehisa et al. |
| 2013/0200362 | A1 | 8/2013 | Wang et al. |
| 2015/0187953 | A1 | 7/2015 | Koezuka et al. |
| 2017/0117493 | A1 | 4/2017 | Engel et al. |

FOREIGN PATENT DOCUMENTS

| | | |
|---|---|---|
| CN | 103247691 A | 8/2013 |
| CN | 106856199 A | 6/2017 |
| JP | H04206732 A | 7/1992 |
| JP | H10173197 A | 6/1998 |
| JP | 2001148480 A | 5/2001 |
| JP | 2002221735 A | 8/2002 |
| JP | 2003264198 A | 9/2003 |
| JP | 2010040645 A | 2/2010 |
| JP | 2013080915 A | 5/2013 |
| JP | 2015179818 A | 10/2015 |

OTHER PUBLICATIONS

The Extended European Search Report in the European Patent Application No. 17909657.3, dated Mar. 4, 2021.
First Office Action in the Japanese Patent Application No. 2018562182, dated Jun. 29, 2021; English translation attached.
First Office Action in the Chinese Patent Application No. 201780000933.2, dated Aug. 18, 2021; English translation attached.

* cited by examiner

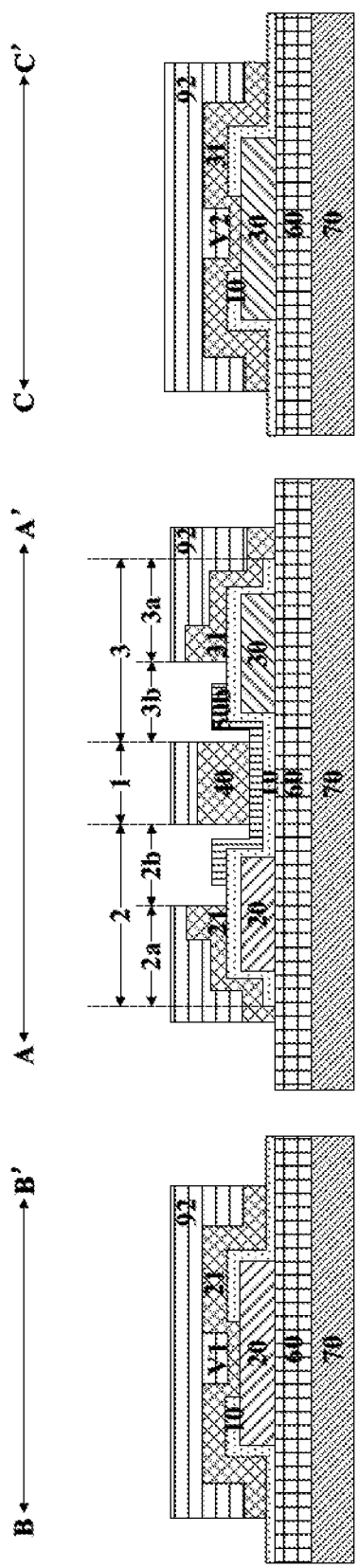

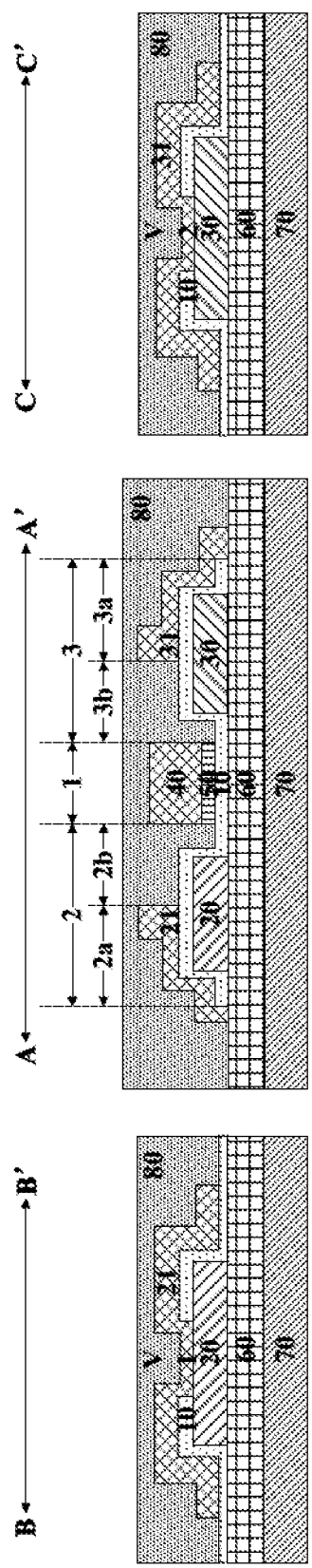

THIN FILM TRANSISTOR, ARRAY SUBSTRATE, DISPLAY APPARATUS, AND METHOD OF FABRICATING THIN FILM TRANSISTOR

CROSS-REFERENCE TO RELATED APPLICATION

This application is a national stage application under 35 U.S.C. § 371 of International Application No. PCT/CN2017/099983, filed Aug. 31, 2017, the contents of which are incorporated by reference in the entirety.

TECHNICAL FIELD

The present invention relates to display technology, and more particularly, to a thin film transistor, an array substrate, a display apparatus, and a method of fabricating a thin film transistor.

BACKGROUND

Display apparatuses such as liquid crystal display (LCD) apparatuses and organic light-emitting diode (OLED) display apparatuses have been widely used. LCD and OLED display devices use thin film transistor (TFT) to control pixels in the display panel. Examples of TFT include amorphous silicon TFT, polycrystalline silicone TFT, single crystal silicon TFT, metal oxide TFT, as well as organic semiconductor TFT.

SUMMARY

In one aspect, the present invention provides a thin film transistor comprising a first source electrode and a first drain electrode spaced apart from each other, an active layer on the first source electrode and the first drain electrode, the active layer having a channel part between the first source electrode and the first drain electrode, a source electrode contact part electrically connected to the first source electrode, and a drain electrode contact part electrically connected to the first drain electrode; a second source electrode on a side of the source electrode contact part distal to the first source electrode, the second source electrode being electrically connected to the first source electrode; and a second drain electrode on a side of the drain electrode contact part distal to the first drain electrode, the second drain electrode being electrically connected to the first drain electrode.

Optionally, the source electrode contact part comprises a first portion of the source electrode contact part sandwiched between the first source electrode and the second source electrode; and the drain electrode contact part comprises a first portion of the drain electrode contact part sandwiched between the first drain electrode and the second drain electrode.

Optionally, the source electrode contact part comprises a second portion of the source electrode contact part; the drain electrode contact part comprises a second portion of the drain electrode contact part; and the second portion of the source electrode contact part and the second portion of the drain electrode contact part are conductive portions.

Optionally, the thin film transistor further comprises a first via extending through the source electrode contact part and a second via extending through the drain electrode contact part; the second source electrode is electrically connected to the first source electrode through the first via; and the second drain electrode is electrically connected to the first drain electrode through the second via.

Optionally, the thin film transistor further comprises a gate insulating layer on the active layer; and a gate electrode on a side of the gate insulating layer distal to the channel part.

Optionally, the gate electrode, the second source electrode, and the second drain electrode are in a same layer and comprise a same material.

Optionally, the active layer comprises a metal oxide semiconductor material.

Optionally, the thin film transistor is a top-gate type thin film transistor.

In another aspect, the present invention provides an array substrate comprising the thin film transistor described herein or fabricated by a method described herein.

Optionally, the array substrate further comprises an alignment mark in an alignment region of the array substrate; wherein the alignment mark is in a same layer as the first source electrode and the first drain electrode.

In another aspect, the present invention provides a display apparatus comprising the thin film transistor described herein or fabricated by a method described herein.

Optionally, the display apparatus is a top-emission type display apparatus; and a light emitting side of the display apparatus is on a side of the second source electrode and the second drain electrode distal to the active layer.

In another aspect, the present invention provides a method of fabricating a thin film transistor, comprising forming a first source electrode and a first drain electrode spaced apart from each other; forming an active layer on the first source electrode and the first drain electrode, the active layer being formed to have a channel part between the first source electrode and the first drain electrode, a source electrode contact part electrically connected to the first source electrode, and a drain electrode contact part electrically connected to the first drain electrode; forming a second source electrode on a side of the source electrode contact part distal to the first source electrode, the second source electrode being formed to be electrically connected to the first source electrode; and forming a second drain electrode on a side of the drain electrode contact part distal to the first drain electrode, the second drain electrode being formed to be electrically connected to the first drain electrode.

Optionally, a first portion of the source electrode contact part is formed to be sandwiched between the first source electrode and the second source electrode; and a first portion of the drain electrode contact part is formed to be sandwiched between the first drain electrode and the second drain electrode.

Optionally, subsequent to forming the second source electrode, further comprising applying a conductive treatment on a second portion of the source electrode contact part; and subsequent to forming the second drain electrode, further comprising applying a conductive treatment on a second portion of the drain electrode contact part.

Optionally, the conductive treatment on the second portion of the source electrode contact part and the second portion of the drain electrode contact part are performed using a plasma.

Optionally, the plasma comprises one or a combination of hydrogen, helium, nitrogen, and argon.

Optionally, the method further comprises forming a first via extending through the source electrode contact part and a second via extending through the drain electrode contact part; wherein the second source electrode is electrically connected to the first source electrode through the first via;

and the second drain electrode is electrically connected to the first drain electrode through the second via.

Optionally, the method further comprises forming a gate insulating layer on the active layer; and forming a gate electrode on a side of the gate insulating layer distal to the channel part.

Optionally, the gate electrode, the second source electrode, and the second drain electrode are formed in a same process, in a same layer, and are formed using a same material.

In another aspect, the present invention provides a method of fabricating an array substrate, comprising forming a thin film transistor according to the method described herein.

Optionally, the method further comprises forming an alignment mark; wherein the alignment mark is formed in a same layer and in a same patterning process as the first source electrode layer and the first drain electrode layer.

BRIEF DESCRIPTION OF THE FIGURES

The following drawings are merely examples for illustrative purposes according to various disclosed embodiments and are not intended to limit the scope of the present invention.

FIG. 7A to 7H illustrate a process of fabricating a thin film transistor in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
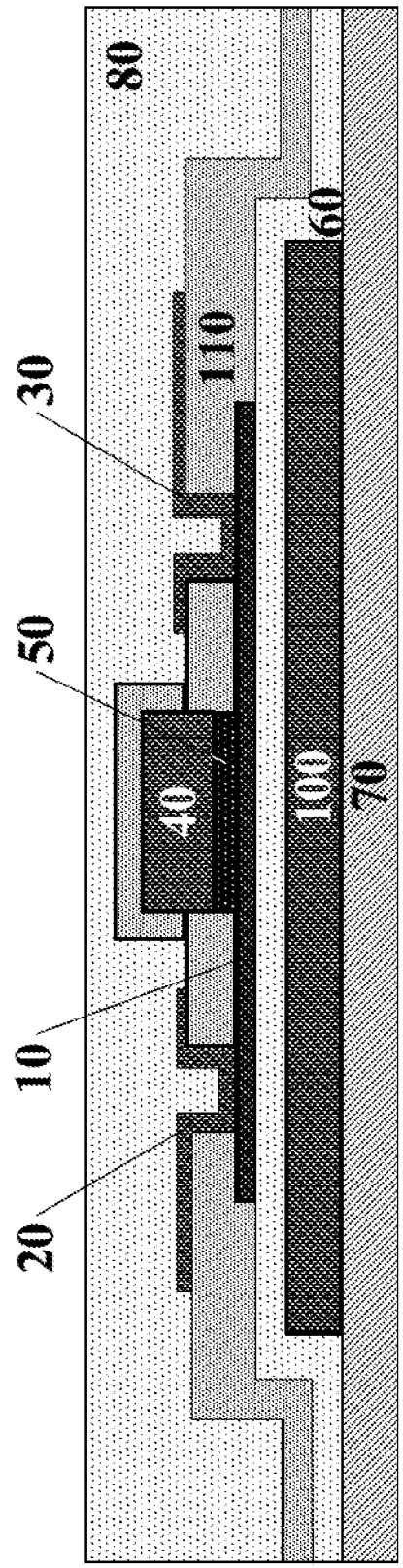
FIG. 1 is a schematic diagram illustrating the structure of a conventional thin film transistor.

FIG. 1 is a schematic diagram illustrating the structure of a conventional thin film transistor. Referring to FIG. 1, the thin film transistor is a top-gate type thin film transistor used in a bottom-emission type display apparatus. The bottom-emission type display apparatus includes a light shielding layer 100 on a base substrate 70, a buffer layer 60 on a side of the light shielding layer 100 distal to the base substrate 70, an active layer 10 on a side of the buffer layer 60 distal to the base substrate 70, a gate insulating layer 50 on a side of the active layer 10 distal to the buffer layer 60, a gate electrode 40 on a side of the gate insulating layer 50 distal to the active layer 10, a source electrode 20, and a drain electrode 30. The source electrode 20 and the drain electrode 30 are respectively connected to a source contact region and a drain contact region of the active layer 10 through vias extending through an insulating layer. In the conventional bottom-emission type display apparatus, an alignment mark can be formed in a same layer as the light shielding layer. A total of five mask plates are needed to form the conventional bottom-emission type display apparatus.

In a top-emission type display apparatus, however, a light shielding layer is typically not necessary especially when the thin film transistor is a top-gate type thin film transistor. In a top-emission type display apparatus not having a light shielding layer, it is not ideal to form the alignment marks in a same layer as the active layer, because the semiconductor material for making the active layer is transparent or semi-transparent. Forming an independent metal layer serving as the alignment marks adds to the manufacturing costs.

Accordingly, the present disclosure provides, inter alia, a thin film transistor, an array substrate, a display apparatus, and a method of fabricating a thin film transistor that substantially obviate one or more of the problems due to limitations and disadvantages of the related art. In one aspect, the present disclosure provides a thin film transistor. In some embodiments, the thin film transistor includes a first source electrode and a first drain electrode spaced apart from each other; an active layer on the first source electrode and the first drain electrode, the active layer having a channel part between the first source electrode and the first drain electrode, a source electrode contact part electrically connected to the first source electrode, and a drain electrode contact part electrically connected to the first drain electrode; a second source electrode on a side of the source electrode contact part distal to the first source electrode, the second source electrode being electrically connected to the first source electrode; and a second drain electrode on a side of the drain electrode contact part distal to the first drain electrode, the second drain electrode being electrically connected to the first drain electrode. In the present thin film transistor, the alignment marks can be formed in a same layer as the first source electrode layer and the first drain electrode layer, thus reducing the total number of mask plates required in the fabrication process. Moreover, much enhanced electrical properties can be achieved in the present thin film transistor.

Figure 2:
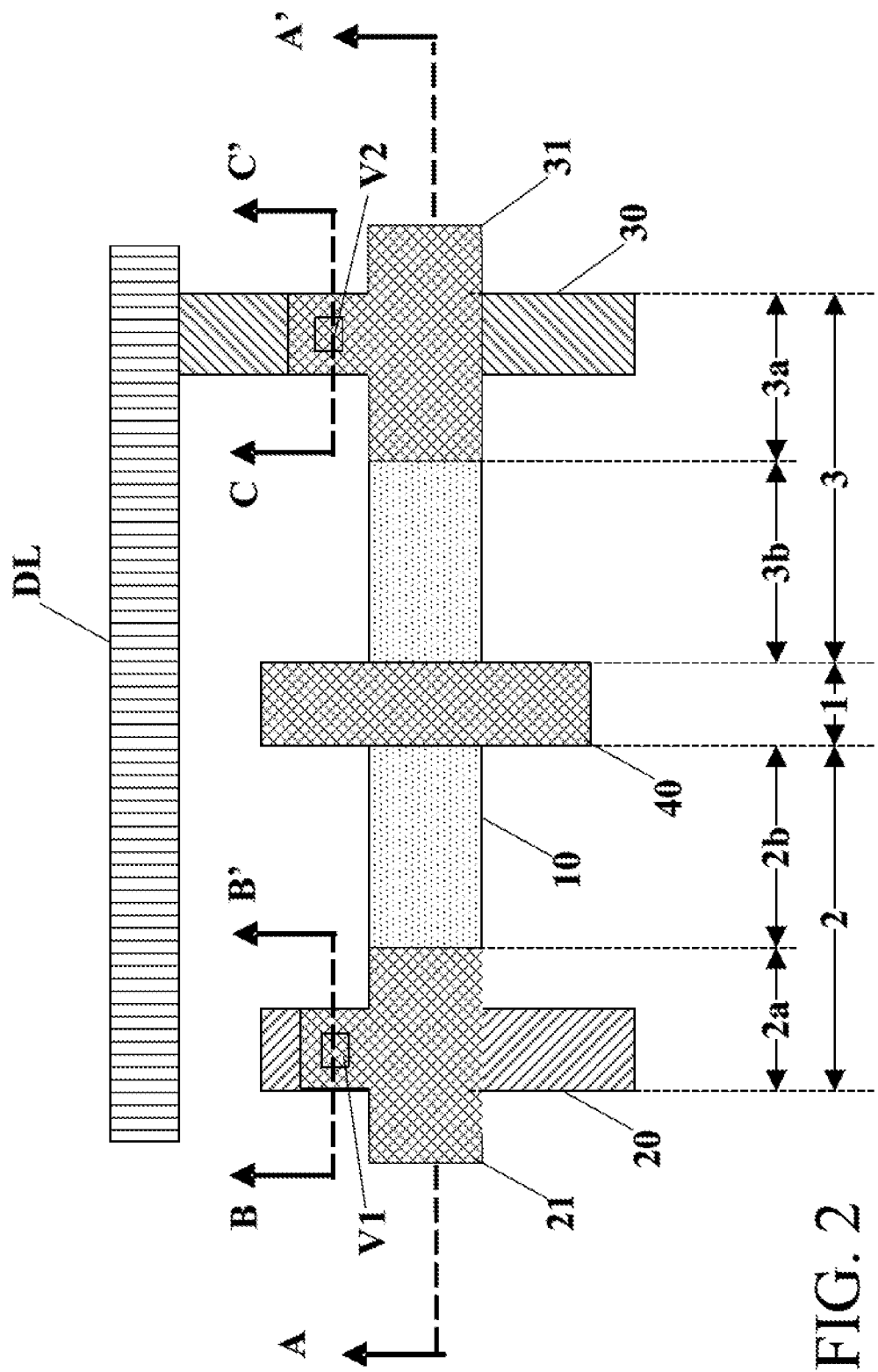
FIG. 2 is a schematic diagram illustrating the structure of a thin film transistor in some embodiments according to the present disclosure.
Figure 3:
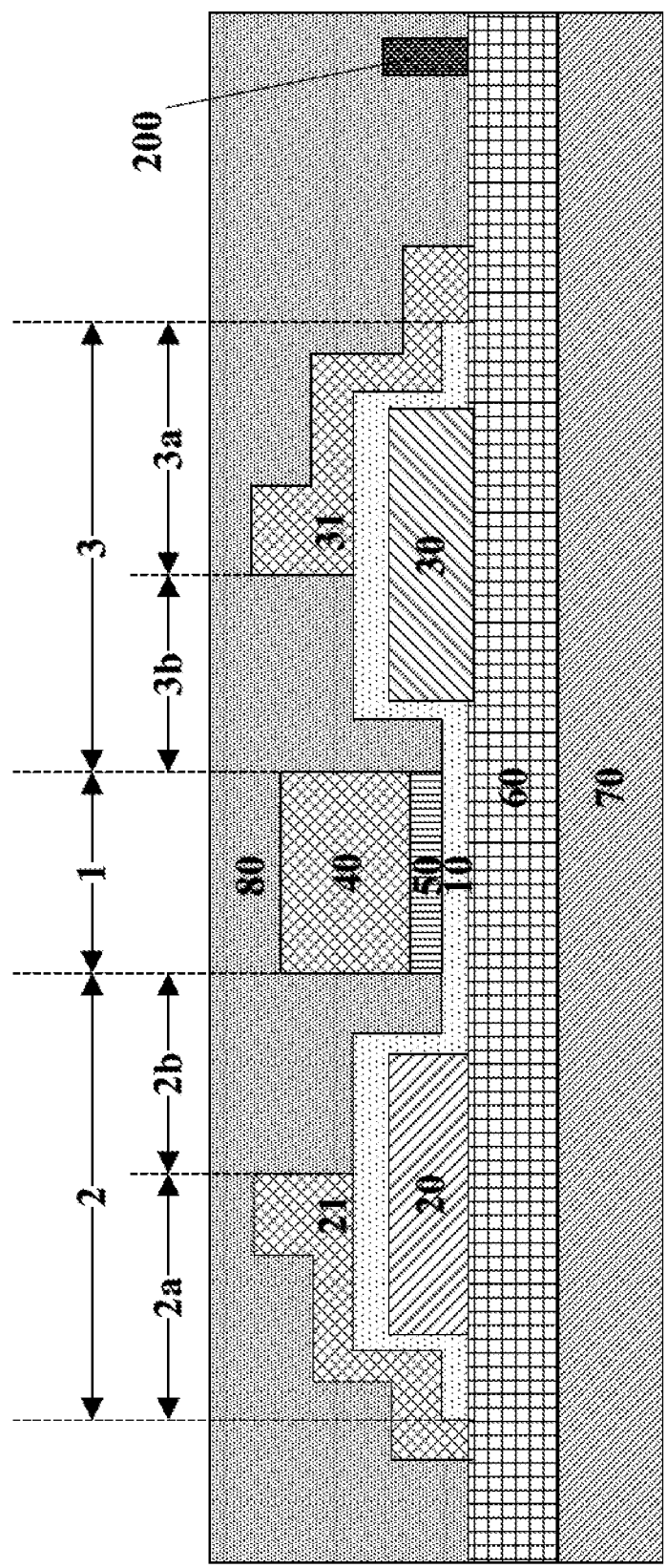
FIG. 3 is a cross-sectional view along line A-A' in a thin film transistor of FIG. 2 in some embodiments according to the present disclosure.

FIG. 2 is a schematic diagram illustrating the structure of a thin film transistor in some embodiments according to the present disclosure. FIG. 3 is a cross-sectional view along line A-A' in a thin film transistor of FIG. 2 in some embodiments according to the present disclosure. Referring to FIG. 2, the thin film transistor in some embodiments includes a first source electrode 20 and a first drain electrode 30 spaced apart from each other. The first source electrode 20 and the first drain electrode 30 may be disposed on a base substrate 70. Optionally, the first source electrode 20 and the first drain electrode 30 are disposed on a buffer layer 60 on the base substrate 70. The thin film transistor further includes an active layer 10 on the first source electrode 20 and the first drain electrode 30, e.g., on a side of the first source electrode 20 and the first drain electrode 30 distal to the buffer layer 60. The active layer 10 has a channel part 1 between the first source electrode 20 and the first drain electrode 30, a source electrode contact part 2 in contact with the first source electrode 20, and a drain electrode contact part 3 in contact with the first drain electrode 30. The thin film transistor further includes a second source electrode 21 and a second drain electrode 31. The second source electrode 21 is on a side of the source electrode contact part 2 distal to the first source electrode 20. The second source electrode 21 is electrically connected to the first source electrode 20. The second drain electrode 31 is on a side of the drain electrode contact part 3 distal to the first drain electrode 30. The second drain electrode 31 is electrically connected to the first drain electrode 30.

Referring to FIG. 2 and FIG. 3, the source electrode contact part 2 includes a first portion 2a of the source electrode contact part 2 and a second portion 2b of the source electrode contact part 2; and the drain electrode contact part 3 includes a first portion 3a of the drain electrode contact part 3 and a second portion 3b of the drain electrode contact part 3. The first portion 2a of the source electrode contact part 2 is sandwiched between the first source electrode 20 and the second source electrode 21. The first portion 3a of the drain electrode contact part 3 is sandwiched between the first drain electrode 30 and the second drain electrode 31. Optionally, a projection of the active layer on the base substrate 70 substantially coven projections of the second source electrode 21 and the second drain electrode 31 on the base substrate 70. Optionally, a projection of the first portion 2a of the source electrode contact part 2 on the base substrate 70 substantially overlaps with the projection of the second source electrode 21 on the base substrate 70. Optionally, a projection of the first portion 3a of the drain electrode contact part 3 on the base substrate 70 substantially overlaps with the projection of the second drain electrode 31 on the base substrate 70.

Optionally, the first portion 2a of the source electrode contact part 2 is in contact with both the first source electrode 20 and the second source electrode 21. Optionally, the thin film transistor further includes an ohmic contact layer between the first portion 2a of the source electrode contact part 2 and the first source electrode 20. Optionally, the thin film transistor further includes an ohmic contact layer between the first portion 2a of the source electrode contact part 2 and the second source electrode 21. Optionally, the first portion 3a of the drain electrode contact part 3 is in contact with both the first drain electrode 30 and the second drain electrode 31. Optionally, the thin film transistor further includes an ohmic contact layer between the first portion 3a of the drain electrode contact part 3 and the first drain electrode 30. Optionally, the thin film transistor further includes an ohmic contact layer between the first portion 3a of the drain electrode contact part 3 and the second drain electrode 31.

The second portion 2b of the source electrode contact part 2 is not covered by the second source electrode 21, and the second portion 3b of the drain electrode contact part 3 is not covered by the second drain electrode 31. During the fabricating process of the thin film transistor, subsequent to forming the second source electrode 21 and the second drain electrode 31, the second portion 2b of the source electrode contact part 2 and the second portion 3b of the drain electrode contact part 3 are exposed. Optionally, a conductive treatment is applied on the second portion 2b of the source electrode contact part 2 and the second portion 3b of the drain electrode contact part 3, e.g., by a plasma treatment. Optionally, the second portion 2b of the source electrode contact part 2 and the second portion 3b of the drain electrode contact part 3 are conductive portions. In some embodiments, the active layer includes a metal oxide semiconductor material, and the conductive treatment is performed by reducing the oxygen content of the second portion 2b of the source electrode contact part 2 and the second portion 3b of the drain electrode contact part 3, e.g., the second portion 2b of the source electrode contact part 2 and the second portion 3b of the drain electrode contact part 3 are partially metalized portions. The conductive treatment may be performed by, e.g., treating the second portion 2b of the source electrode contact part 2 and the second portion 3b of the drain electrode contact part 3 with a hydrogen plasma, a helium plasma, a nitrogen plasma, an argon plasma, or a combination thereof.

In the present thin film transistor, the first source electrode 20 and the first drain electrode 30 are on a side of the active layer 10 proximal to the base substrate 70. For example, subsequent to the fabrication of the active layer, the first source electrode 20 and the first drain electrode 30 are at least partially buried underneath the active layer 10. Typically, only a thin layer on the exposed surface of the active layer 10 can become conductive by the conductive treatment (e.g., by a plasma treatment). The interface between the active layer 10 and the first source electrode 20, and the interface between the active layer 10 and the first drain electrode 30, are not exposed but buried. Thus, conductive treatment of the active layer is not effective to enhance the electrical conduction between the active layer 10 and the first source electrode 20 and between the active layer 10 and the first drain electrode 30. By having a second source electrode 21 and a second drain electrode 31 on a side of the active layer 10 distal to the first source electrode 20 and the first drain electrode 30, conductive treatment of the second portion 2b of the source electrode contact part 2 and the second portion 3b of the drain electrode contact part 3 effectively enhances the electrical conduction between the active layer 10 and the second source electrode 21 and between the active layer 10 and the second drain electrode 31. The electrical characteristics of the present thin film transistor are significantly improved as compared to the conventional thin film transistor.

Referring to FIG. 3, in some embodiments, an alignment mark 200 is formed in a same layer as the first source electrode 20 and the first drain electrode 30, e.g., the alignment mark 200 is formed in a same patterning step as the first source electrode 20 and the first drain electrode 30.

Figure 4A:
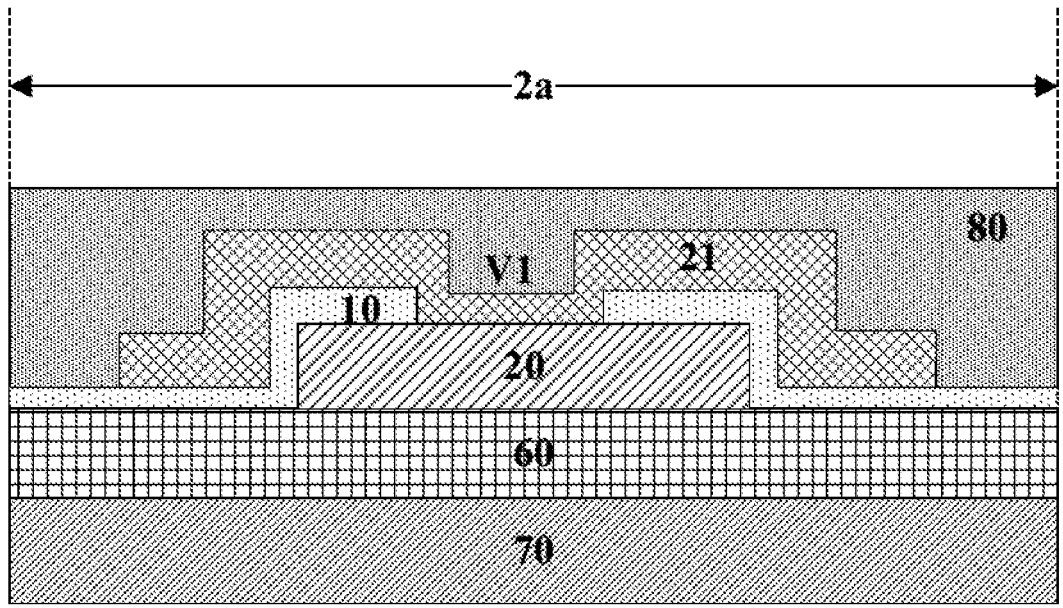
FIG. 4A is a cross-sectional view along line B-B' in a thin film transistor of FIG. 2 in some embodiments according to the present disclosure.
Figure 4B:
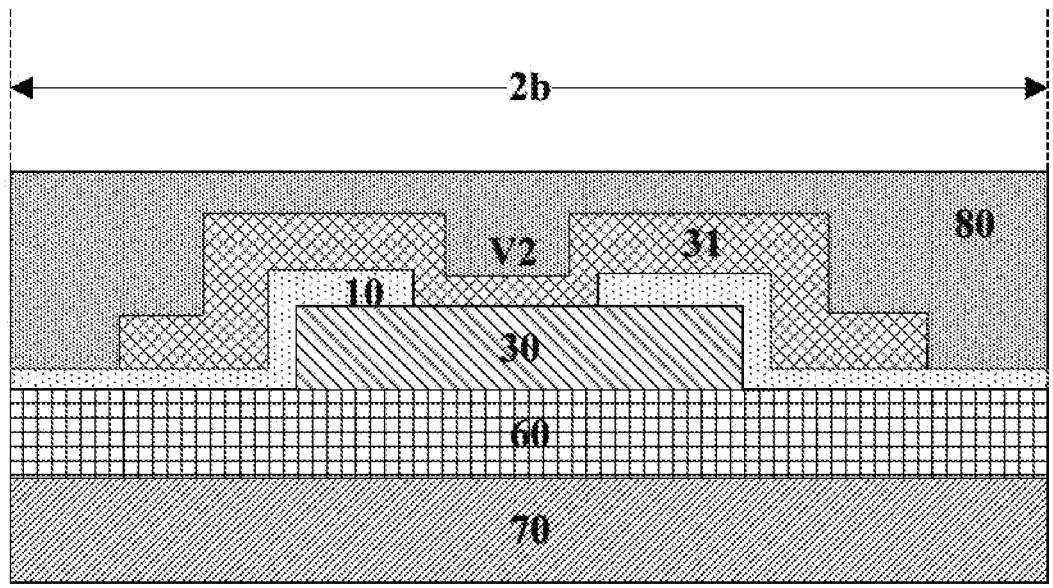
FIG. 4B is a cross-sectional view along line B-B' in a thin film transistor of FIG. 2 in some embodiments according to the present disclosure.

In some embodiments, the second source electrode 21 is electrically connected to the first source electrode 20, and the second drain electrode 31 is electrically connected to the first drain electrode 30. FIG. 4A is a cross-sectional view along line B-B' in a thin film transistor of FIG. 2 in some embodiments according to the present disclosure. FIG. 4B is a cross-sectional view along line B-B' in a thin film transistor of FIG. 2 in some embodiments according to the present disclosure. Referring to FIG. 4A and FIG. 4B, the thin film transistor in some embodiments further includes a first via V1 extending through the active layer 10 (e.g., the first portion 2a of the source electrode contact part 2) and a second via extending through the active layer 10 (e.g., the first portion 3a of the drain electrode contact part 3). The second source electrode 21 is electrically connected to the first source electrode 20 through the first via V1, and the second drain electrode 31 is electrically connected to the first drain electrode 30 through the second via V2.

Figure 5A:
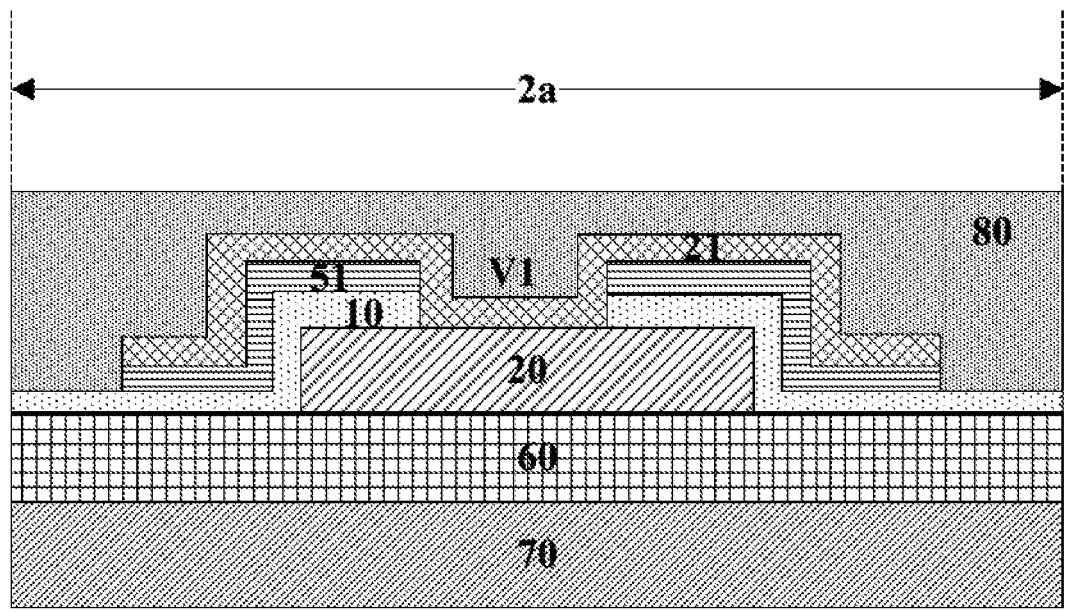
FIG. 5A is a cross-sectional view along line C-C' in a thin film transistor of FIG. 2 in some embodiments according to the present disclosure.
Figure 5B:
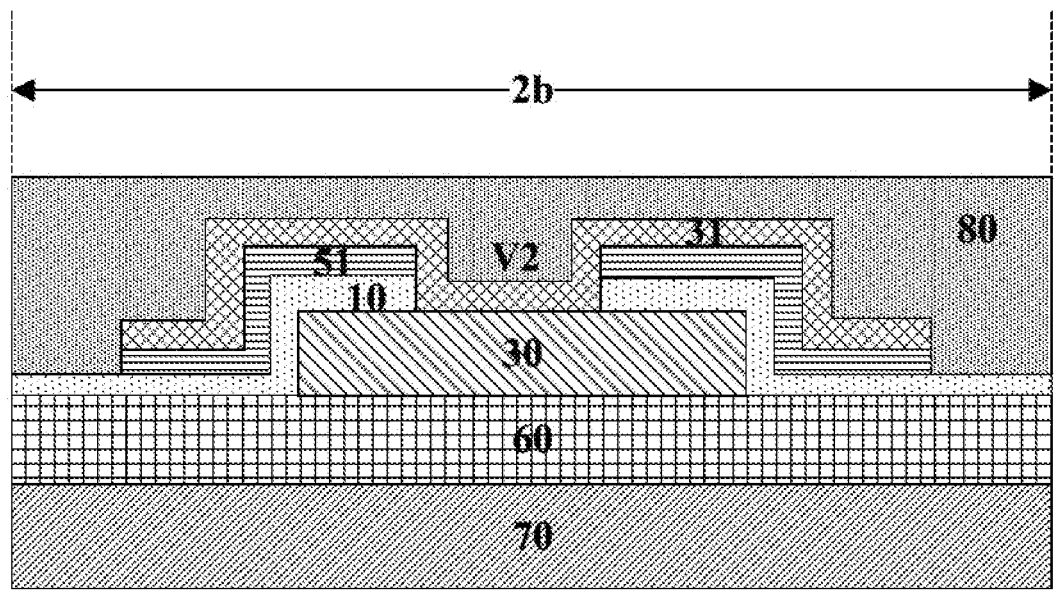
FIG. 5B is a cross-sectional view along line C-C' in a thin film transistor of FIG. 2 in some embodiments according to the present disclosure.

In some embodiments, the thin film transistor further includes an insulating layer between the second source electrode 21 and the first portion 2a of the source electrode contact part 2 and between the second drain electrode 31 and the first portion 3a of the drain electrode contact part 3. FIG. 5A is a cross-sectional view along line C-C' in a thin film transistor of FIG. 2 in some embodiments according to the present disclosure. FIG. 5B is a cross-sectional view along line C-C' in a thin film transistor of FIG. 2 in some embodiments according to the present disclosure. As shown in FIG. 5A and FIG. 5B, the thin film transistor further includes an insulating layer 51 between the second source electrode 21 and the first portion 2a of the source electrode contact part 2 and between the second drain electrode 31 and the first portion 3a of the drain electrode contact part 3. The thin film transistor further includes a first via V1 extending through the active layer 10 (e.g., the source electrode contact part 2a) and the insulating layer 51, and a second via V2 extending through the active layer 10 (e.g., the drain electrode contact part 3) and the insulating layer 51. The second source electrode 21 is electrically connected to the first source electrode 20 through the first via V1, and the second drain electrode 31 is electrically connected to the first drain electrode 30 through the second via V2.

Figure 6A:
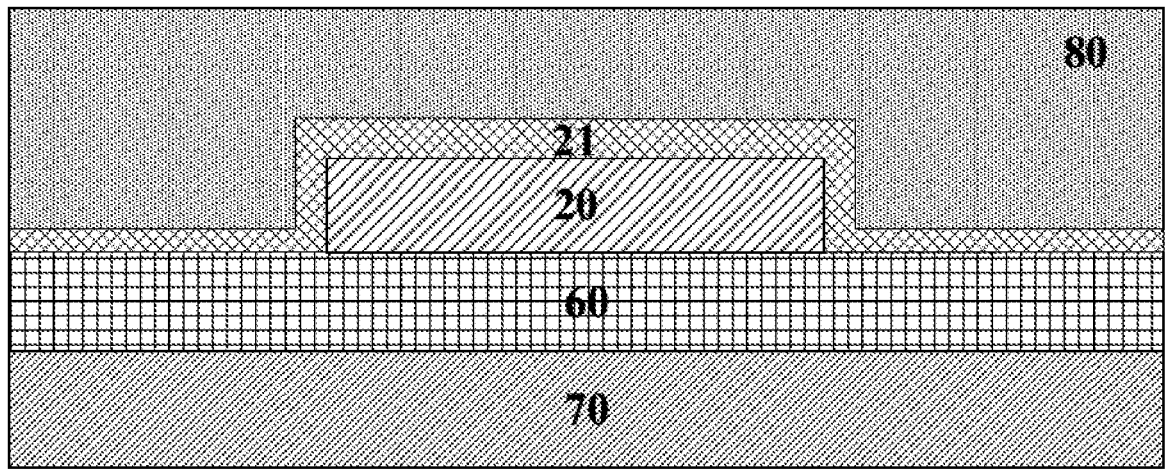
FIG. 6A is a cross-sectional view along line C-C' in a thin film transistor of FIG. 2 in some embodiments according to the present disclosure.
Figure 6B:
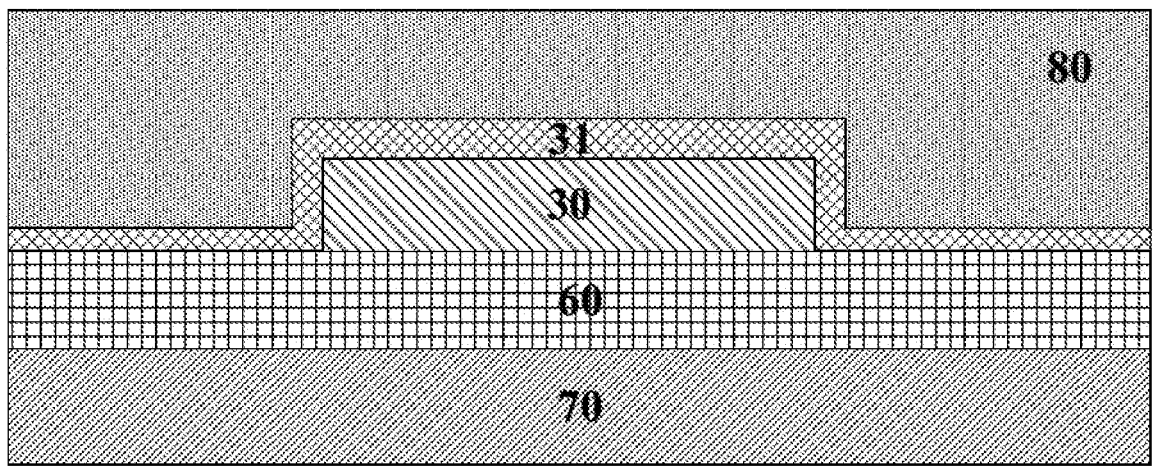
FIG. 6B is a cross-sectional view along line C-C' in a thin film transistor of FIG. 2 in some embodiments according to the present disclosure.

In some embodiments, a portion of the second source electrode 21 is directly disposed on a portion of the first source electrode 20, and a portion of the second drain electrode 31 is directly disposed on a portion of the first drain electrode 30. FIG. 6A is a cross-sectional view along line C-C' in a thin film transistor of FIG. 2 in some embodiments according to the present disclosure. FIG. 6B is a cross-sectional view along line C-C' in a thin film transistor of FIG. 2 in some embodiments according to the present disclosure. Referring to FIG. 6A, the active layer 10 and the insulating layer 51 are absent in a region corresponding to a portion of the first source electrode 20 and a portion of the second source electrode 21, and the portion of the first source electrode 20 is directly electrically connected to the portion of the second source electrode 21 in the region. Referring to FIG. 6B, the active layer 10 and the insulating layer 51 are absent in a region corresponding to a portion of the first drain electrode 30 and a portion of the second drain electrode 31, and the portion of the first drain electrode 30 is directly electrically connected to the portion of the second drain electrode 31 in the region. This design obviates the need of forming a first via V1 for connecting the first source electrode 20 and the second source electrode 21 and the need of forming a second via V2 for connecting the first drain electrode 30 and the second drain electrode 31.

Referring to FIG. 2 and FIG. 3, the thin film transistor in some embodiments further includes a gate insulating layer 50 on the active layer 10, and a gate electrode 40 on a side of the gate insulating layer 50 distal to the channel part 1. Optionally, the gate electrode 40, the second source electrode 21, and the second drain electrode 31 are in a same layer and include a same material. The thin film transistor further includes a passivation layer 80 on a side of the gate electrode 40 distal to the base substrate 70. Optionally, the first source electrode 20 is electrically connected to a data line DL. Optionally, the second source electrode 21 is electrically connected to a data line DL. As used herein, the term "same layer" refers to the relationship between the layers simultaneously formed in the same step. In one example, the gate electrode 40, the second source electrode 21, and the second drain electrode 31 are in a same layer when they are formed as a result of one or more steps of a same patterning process performed in a same layer of material. In another example, the gate electrode 40, the second source electrode 21, and the second drain electrode 31 can be formed in a same layer by simultaneously performing the step of forming the gate electrode 40, the step of forming the second source electrode 21, and the step of forming the second drain electrode 31. The term "same layer" does not always mean that the thickness of the layer or the height of the layer in a cross-sectional view is the same.

Optionally, the active layer includes a metal oxide semiconductor material, e.g., indium tin oxide, indium gallium zinc oxide, indium zinc oxide, indium gallium tin oxide, and so on.

Optionally, the thin film transistor is a top-gate type thin film transistor.

In another aspect, the present disclosure provides a method of fabricating a thin film transistor. In some embodiments, the method includes forming a first source electrode and a first drain electrode spaced apart from each other; forming an active layer on the first source electrode and the first drain electrode, the active layer being formed to have a channel part between the first source electrode and the first drain electrode, a source electrode contact part electrically connected to the first source electrode, and a drain electrode contact part electrically connected to the first drain electrode; forming a second source electrode on a side of the source electrode contact part distal to the first source electrode, the second source electrode being formed to be electrically connected to the first source electrode; and forming a second drain electrode on a side of the drain electrode contact part distal to the first drain electrode, the second drain electrode being formed to be electrically connected to the first drain electrode.

In some embodiments, a first portion of the source electrode contact part is formed to be sandwiched between the first source electrode and the second source electrode; and a first portion of the drain electrode contact part is formed to be sandwiched between the first drain electrode and the second drain electrode.

Optionally, the first portion of the source electrode contact part is formed to be in contact with both the first source electrode and the second source electrode. Optionally, the method further includes forming an ohmic contact layer between the first portion of the source electrode contact part and the first source electrode. Optionally, the method further includes forming an ohmic contact layer between the first portion of the source electrode contact part and the second source electrode. Optionally, the first portion of the drain electrode contact part is formed to be in contact with both the first drain electrode and the second drain electrode. Optionally, the method further includes forming an ohmic contact layer between the first portion of the drain electrode contact part and the first drain electrode. Optionally, the method further includes forming an ohmic contact layer between the first portion of the drain electrode contact part and the second drain electrode.

In some embodiments, subsequent to forming the second source electrode, the method further includes applying a conductive treatment on a second portion of the source electrode contact part; and subsequent to forming the second drain electrode, applying a conductive treatment on a second portion of the drain electrode contact part. Various appropriate conductive treatment methods may be used for developing conductivity of the second portion of the source electrode contact part and the second portion of the drain electrode contact part. Optionally, the second portion of the source electrode contact part and the second portion of the drain electrode contact part are converted into conductive portions by a plasma, e.g., a plasma containing a reducing gas or inert gas. Optionally, the method includes treating the second portion of the source electrode contact part and the second portion of the drain electrode contact part with a hydrogen plasma, a helium plasma, a nitrogen plasma, an argon plasma, or a combination thereof.

In some embodiments, the method further includes forming a first via extending through the source electrode contact part and a second via extending through the drain electrode contact part. The second source electrode is electrically connected to the first source electrode through the first via. The second drain electrode is electrically connected to the first drain electrode through the second via.

In some embodiments, the method further includes forming a gate insulating layer on the active layer; and forming a gate electrode on a side of the gate insulating layer distal to the channel part. Optionally, the gate electrode, the second source electrode, and the second drain electrode are forming in a same process, in a same layer, and using a same material.

Figure 7A:
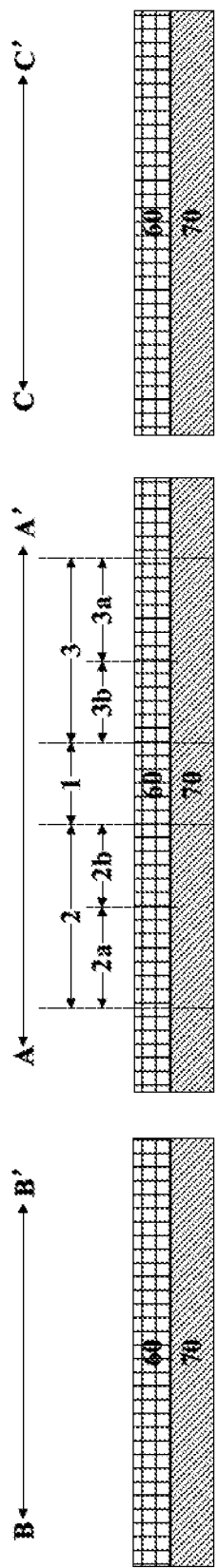
Figure 7B:
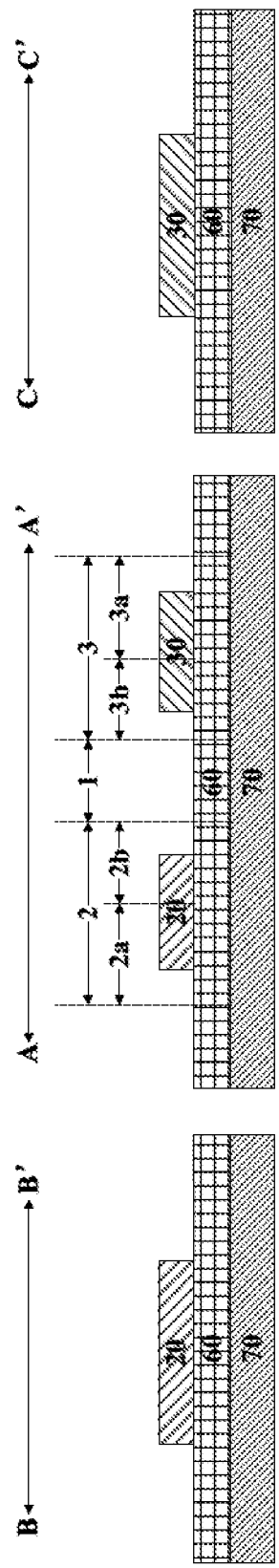
Figure 7C:
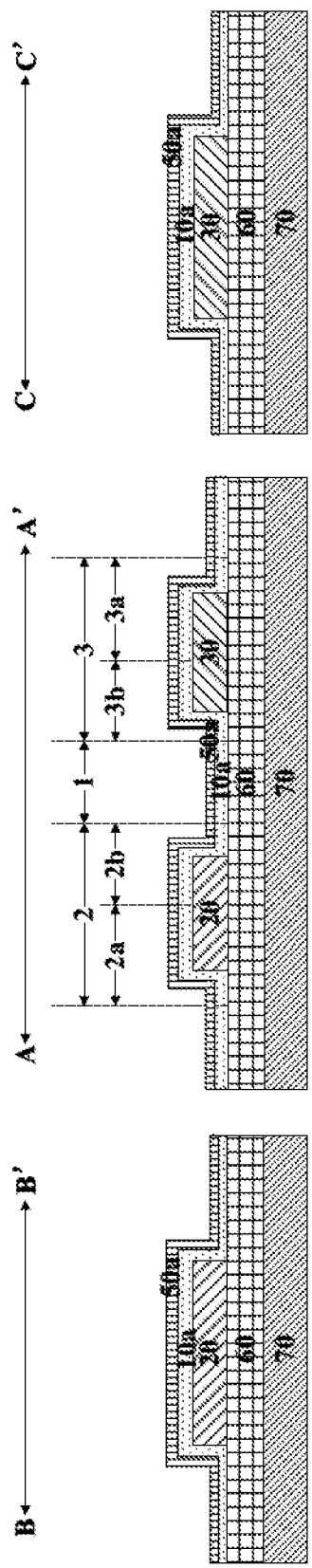

FIG. 7A to 7H illustrate a process of fabricating a thin film transistor in some embodiments according to the present disclosure. The left panels in FIG. 7A to 7H correspond to cross-sectional views along line B-B' in a thin film transistor of FIG. 2. The middle panels in FIG. 7A to 7H correspond to cross-sectional views along line A-A' in a thin film transistor of FIG. 2. The right panels in FIG. 7A to 7H correspond to cross-sectional views along line C-C' in a thin film transistor of FIG. 2. Referring to FIG. 7A, a buffer layer 60 is first formed on the base substrate 70. Referring to FIG. 7B, on top of the buffer layer 60, a first source electrode 20 and a first drain electrode 30 are formed on a side of the buffer layer 60 distal to the base substrate 70. The first source electrode 20 and the first drain electrode 30 are spaced apart from each other. A channel part 1 of an active layer to is to be formed in a region between the first source electrode 20 and the first drain electrode 30. Referring to FIG. 7C, a semiconductor material layer 10a is formed on a side of the first source electrode 20 and the first drain electrode 30 distal to the buffer layer 60, and a first insulating material layer 50a is formed on a side of the semiconductor material layer 10a distal to the base substrate 70.

Figure 7D:
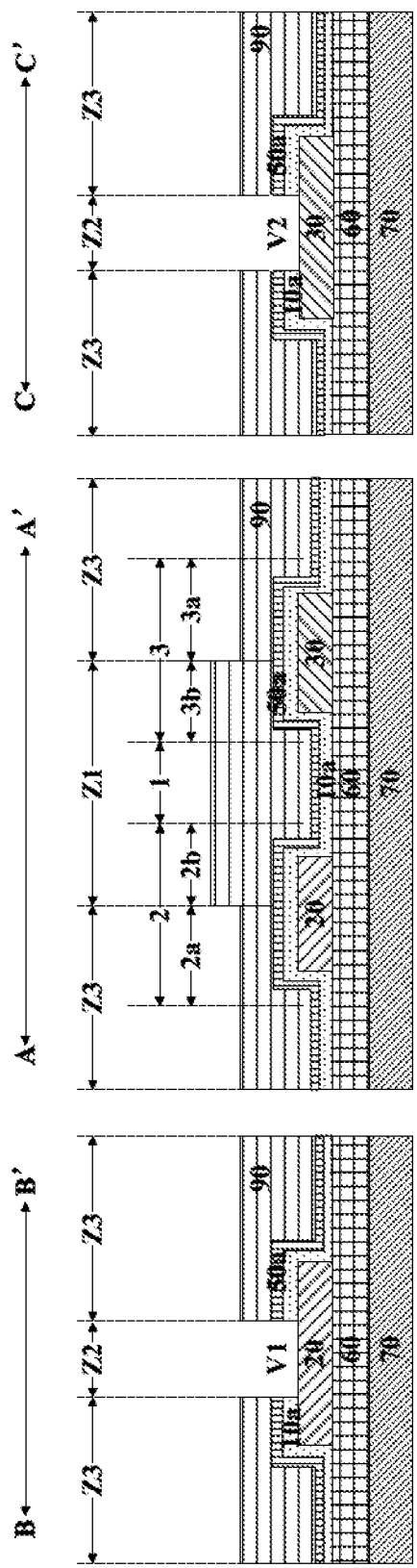

Referring to FIG. 7D, a first photoresist layer 90 is formed on a side of the first insulating material layer 50a distal to the semiconductor material layer 10a. The first photoresist layer 90 is then exposed with a half-tone mask plate or a gray-tone mask plate, and subsequently developed. The first photoresist layer 90 is developed to obtain a photoresist pattern having a first section Z, a second section Z2, and a third section Z3. The first section Z1 corresponds to the channel part 1, the second portion 2b of the source electrode contact part 2, and the second portion 3b of the drain electrode contact part 3. The second section Z2 corresponds to the first via V1 and the second via V2 each extending through the first insulating material layer 50a and the semiconductor material layer 10a. The first via V1 and the second via V2 are formed for respectively electrically connecting the first source electrode 20 to the second source electrode 21 to be formed, and electrically connecting the first drain electrode 30 to the second drain electrode 31 to be formed. The third section Z3 is outside of the first section Z1 and the second section Z2. The first section Z1 is substantially unexposed. The third section Z3 is partially exposed. The second section Z2 is fully exposed, and the photoresist material is removed in the second section Z2. The first insulating material layer 50a and the semiconductor material layer 10a in the second section Z2 are removed, e.g., by etching, thereby exposing the first source electrode 20 and the first drain electrode 30 in the second section Z2.

Figure 7E:
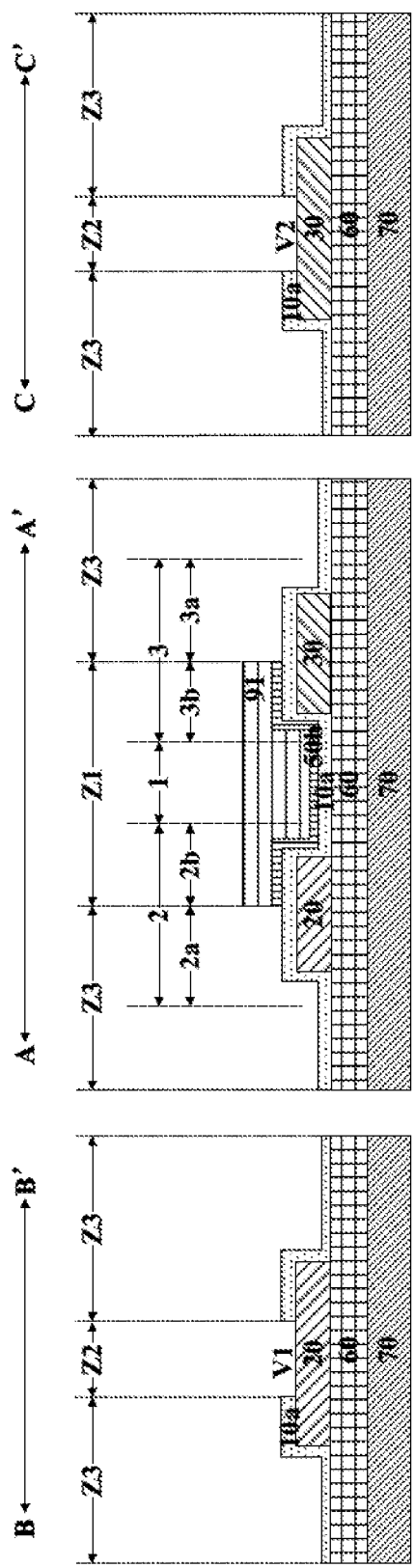

Referring to FIG. 7E, the photoresist material in the third section Z3 is then removed, e.g., by ashing, thereby exposing the first insulating material layer 50a in the third section Z3. The photoresist material in the first section Z remains, thereby forming a second photoresist layer 91. The first insulating material layer 50a in the third section Z3 is then removed, e.g., by etching. Subsequently, the second photoresist layer 91 in the first section Z1 is removed, thereby forming a second insulating material layer 50b.

Referring to FIG. 7F, a gate electrode 40 is formed on a side of the second insulating material layer 50b distal to the channel part 1 of the active layer 10; a second source electrode 21 is formed on a side of a first portion 2a of the source electrode contact part 2 distal to the first source electrode 20; and a second drain electrode 31 is formed on a side of a first portion 3a of the drain electrode contact part 3 distal to the first drain electrode 30. Subsequently, a third photoresist layer 92 is formed on a side of the second source electrode 21, gate electrode 40, and the second drain electrode 31 distal to the base substrate 70. The third photoresist layer 92 is exposed and developed to have a photoresist pattern. The photoresist material in regions corresponding to the channel part 1, the first portion 2a of the source electrode contact part 2, and the first portion 3a of the drain electrode contact part 3 remains. The photoresist material in regions corresponding to the second portion 2b of the source electrode contact part 2 and the second portion 3b of the drain electrode contact part 3 is removed, thereby exposing the second insulating material layer 50b.

Figure 7G:
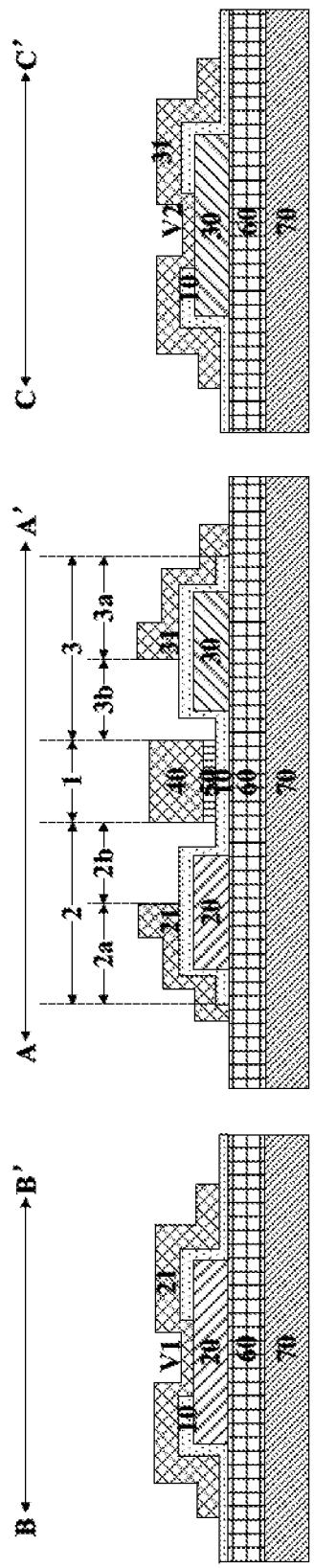

Referring to FIG. 7G, the second insulating material layer 50b in regions corresponding to the second portion 2b of the source electrode contact part 2 and the second portion 3b of the drain electrode contact part 3 is removed. e.g., by etching, thereby forming the gate insulating layer 50. Subsequently, the third photoresist layer 92 is then removed. The second portion 2b of the source electrode contact part 2 and the second portion 3b of the drain electrode contact part 3 are now exposed. The second portion 2b of the source electrode contact part 2 and the second portion 3b of the drain electrode contact part 3 are then converted into conductive portions, e.g., by a plasma, as discussed above.

Referring to FIG. 7H, a passivation layer 80 is formed on a side of the gate electrode 40, the second source electrode 21, and the second drain electrode 31 distal to the base substrate 70.

In another aspect, the present disclosure provides an array substrate having a thin film transistor described herein or fabricated by a method described herein. In some embodiments, the array substrate is a top-emission type array substrate; and a light emitting side of the array substrate is on a side of the second source electrode and the second drain electrode distal to the active layer.

In another aspect, the present disclosure provides a method of fabricating an array substrate. In some embodiments, the method of fabricating an array substrate includes forming one or more thin film transistors according to a method of fabricating a thin film transistor described herein. Optionally, the method further includes forming an alignment mark. Optionally, the alignment mark is formed in a same layer using a same material as the first source electrode layer and the first drain electrode layer. Optionally, the alignment mark is formed in a same patterning process (e.g., a single patterning process) as the first source electrode layer and the first drain electrode layer.

In another aspect, the present disclosure provides a display panel having a thin film transistor described herein or fabricated by a method described herein. In some embodiments, the display panel is a top-emission type display panel; and a light emitting side of the display panel is on a side of the second source electrode and the second drain electrode distal to the active layer. Optionally, the display apparatus is a liquid crystal display panel. Optionally, the display apparatus is an organic light emitting diode display panel.

In another aspect, the present disclosure provides a display apparatus having a thin film transistor described herein or fabricated by a method described herein. In some embodiments, the display apparatus is a top-emission type display apparatus; and a light emitting side of the display apparatus is on a side of the second source electrode and the second drain electrode distal to the active layer. Optionally, the display apparatus is a liquid crystal display apparatus. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a thin film transistor and an alignment mark in an alignment region of the array substrate;
    wherein the thin film transistor comprises:
        a first source electrode and a first drain electrode spaced apart from each other;
        an active layer on the first source electrode and the first drain electrode, the active layer having a channel part between the first source electrode and the first drain electrode, a source electrode contact part electrically connected to the first source electrode, and a drain electrode contact part electrically connected to the first drain electrode;
        a second source electrode on a side of the source electrode contact part distal to the first source electrode, the second source electrode being electrically connected to the first source electrode; and
        a second drain electrode on a side of the drain electrode contact part distal to the first drain electrode, the second drain electrode being electrically connected to the first drain electrode;
    wherein the alignment mark is in a same layer as the first source electrode and the first drain electrode.

2. A display apparatus, comprising the array substrate of claim 1.

3. The display apparatus of claim 2, wherein the display apparatus is a top-emission type display apparatus; and
    a light emitting side of the display apparatus is on a side of the second source electrode and the second drain electrode distal to the active layer.

4. The array substrate of claim 1, wherein the source electrode contact part comprises a first portion of the source electrode contact part sandwiched between the first source electrode and the second source electrode; and
    the drain electrode contact part comprises a first portion of the drain electrode contact part sandwiched between the first drain electrode and the second drain electrode.

5. The array substrate of claim 1, wherein the source electrode contact part comprises a second portion of the source electrode contact part;
    the drain electrode contact part comprises a second portion of the drain electrode contact part; and
    the second portion of the source electrode contact part and the second portion of the drain electrode contact part are conductive portions.

6. The array substrate of claim 1, further comprising a first via extending through the source electrode contact part and a second via extending through the drain electrode contact part;
    the second source electrode is electrically connected to the first source electrode through the first via; and
    the second drain electrode is electrically connected to the first drain electrode through the sec via.

7. The array substrate of claim 1, wherein the active layer comprises a metal oxide semiconductor material.

8. The array substrate of claim 1, wherein the thin film transistor is a top-gate type thin film transistor.

9. The array substrate of claim 1, further comprising a gate insulating layer on the active layer; and
    a gate electrode on a side of the gate insulating layer distal to the channel part.

10. The array substrate of claim 9, wherein the gate electrode, the second source electrode, and the second drain electrode are in a same layer and comprise a same material.

11. A method of fabricating an array substrate, comprising:
    forming a thin film transistor; and
    forming an alignment mark;
    wherein forming the thin film transistor comprises:
        forming a first source electrode and a first drain electrode spaced apart from each other;
        forming an active layer on the first source electrode and the first drain electrode, the active layer being formed to have a channel part between the first source electrode and the first drain electrode, a source electrode contact part electrically connected to the first source electrode, and a drain electrode contact part electrically connected to the first drain electrode;

forming a second source electrode on a side of the source electrode contact part distal to the first source electrode, the second source electrode being formed to be electrically connected to the first source electrode; and forming a second drain electrode on a side of the drain electrode contact part distal to the first drain electrode, the second drain electrode being formed to be electrically connected to the first drain electrode;

wherein the alignment mark is formed in a same layer and in a same patterning process as the first source electrode and the first drain electrode.

12. The method of claim 11, wherein a first portion of the source electrode contact part is formed to be sandwiched between the first source electrode and the second source electrode; and a first portion of the drain electrode contact part is formed to be sandwiched between the first drain electrode and the second drain electrode.

13. The method of claim 11, subsequent to forming the second source electrode, further comprising applying a conductive treatment on a second portion of the source electrode contact part; and subsequent to forming the second drain electrode, further comprising applying a conductive treatment on a second portion of the drain electrode contact part.

14. The method of claim 11, further comprising forming a first via extending through the source electrode contact part and a second via extending through the drain electrode contact part;

wherein the second source electrode is electrically connected to the first source electrode through the first via; and the second drain electrode is electrically connected to the first drain electrode through the second via.

15. The method of claim 13, wherein the conductive treatment on the second portion of the source electrode contact part and the second portion of the drain electrode contact part are performed using a plasma.

16. The method of claim 15, wherein the plasma comprising one or a combination of hydrogen, helium, nitrogen, and argon.

17. The method of claim 11, further comprising forming a gate insulating layer on the active layer; and forming a gate electrode on a side of the gate insulating layer distal to the channel part.

18. The method of claim 17, wherein the gate electrode, the second source electrode, and the second drain electrode are forming in a same process, in a same layer, and using a same material.

* * * * *